United States Patent
Broyde et al.

(10) Patent No.: US 7,940,119 B2
(45) Date of Patent: May 10, 2011

(54) MULTIPLE-INPUT AND MULTIPLE-OUTPUT AMPLIFIER USING MUTUAL INDUCTION IN THE FEEDBACK NETWORK

(75) Inventors: Frédéric Broyde, Maule (FR); Evelyne Clavelier, Maule (FR)

(73) Assignee: Excem SAS, Maule (FR)

( * ) Notice: Subject to any disclaimer, the term of this patent is extended or adjusted under 35 U.S.C. 154(b) by 237 days.

(21) Appl. No.: 12/301,929

(22) PCT Filed: Apr. 26, 2007

(86) PCT No.: PCT/IB2007/001344
§ 371 (c)(1),
(2), (4) Date: Nov. 21, 2008

(87) PCT Pub. No.: WO2008/001168
PCT Pub. Date: Jan. 3, 2008

(65) Prior Publication Data
US 2010/0244948 A1    Sep. 30, 2010

(30) Foreign Application Priority Data
Jun. 23, 2006   (FR) ..................... 06 05633

(51) Int. Cl.
*H03F 1/36* (2006.01)
(52) U.S. Cl. ............ 330/84; 330/147; 330/148
(58) Field of Classification Search .......... 330/84, 330/124 R, 147, 148, 295
See application file for complete search history.

(56) References Cited

U.S. PATENT DOCUMENTS

| | | | | |
|---|---|---|---|---|
| 5,093,668 A | * | 3/1992 | Sreenivas | 342/374 |
| 5,751,250 A | * | 5/1998 | Arntz | 330/124 R |
| 6,690,243 B1 | | 2/2004 | Henrion | |
| 7,642,849 B2 | * | 1/2010 | Broyde et al. | 330/84 |
| 2005/0275458 A1 | | 12/2005 | Mukherjee et al. | |

FOREIGN PATENT DOCUMENTS

| | | |
|---|---|---|
| FR | 2 896 360 | 7/2007 |
| WO | WO 2007/083191 | 7/2007 |

OTHER PUBLICATIONS

International Search Report for International Application No. PCT/IB2007/001344, dated Sep. 25, 2007.

* cited by examiner

*Primary Examiner* — Khanh V Nguyen
(74) *Attorney, Agent, or Firm* — Barnes & Thornburg LLP

(57) ABSTRACT

The invention relates to an amplifier capable of producing a plurality of output signals, these output signals being controlled by a plurality of input signals. A multiple-input and multiple-output amplifier of the invention includes 4 signal input terminals, 4 signal output terminals, 4 active sub-circuits and a feedback network. Each active sub-circuit has a sub-circuit input terminals connected to one of the signal input terminals, a sub-circuit output terminal connected to one of the signal output terminals and a sub-circuit common terminal. The feedback network uses mutual induction between windings. The feedback network has terminals connected to the sub-circuit common terminal of the active sub-circuits. The feedback network presents an impedance matrix producing a negative feedback such that the transfer admittance matrix of the multiple-input and multiple-output amplifier approximates a given admittance matrix.

12 Claims, 3 Drawing Sheets

MULTIPLE-INPUT AND MULTIPLE-OUTPUT AMPLIFIER USING MUTUAL INDUCTION IN THE FEEDBACK NETWORK

CROSS-REFERENCE TO RELATED APPLICATIONS

The present application claims the benefit of priority to International Patent Application No. PCT/IB2007/001344 filed Apr. 26, 2007, which further claims the benefit of priority to France Patent Application No. 0605633 filed Jun. 23, 2006, the contents of which are hereby incorporated by reference in their entirety.

FIELD OF THE INVENTION

The invention relates to an amplifier capable of producing a plurality of output signals, these output signals being controlled by a plurality of input signals.

The French patent application number 06/05633 of 23 Jun. 2006, entitled "Amplificateur à entrées multiples et sorties multiples utilisant l'induction mutuelle dans le réseau de rétroaction" is incorporated by reference.

PRIOR ART

Let us consider the problem of designing an amplifier having a plurality of output terminals and a plurality of input terminals, the amplifier being such that the output signals are each a linear combination of a plurality of input signals, in a frequency band.

Let us number these output terminals from 0 to n, where 0 corresponds to the "reference terminal" which will be used as a reference for measuring voltages. The reference terminal is often called the ground terminal, and it is also an input terminal. Any integer j greater than or equal to 1 and less than or equal to n corresponds to the number of a signal output terminal of the amplifier, a signal output terminal being an output terminal other than the reference terminal. Let us define the output current $i_{Oj}$ flowing into the signal output terminal j, and the output voltage $v_{Oj}$ between the signal output terminal j and the reference terminal. We can also define the column-vector $I_O$ of the output currents $i_{O1}, \ldots, i_{On}$ and the column-vector $V_O$ of the output voltages $v_{O1}, \ldots, v_{On}$.

We consider the case where the number of output terminals is equal to the number of input terminals. We number the signal input terminals of the amplifier from 1 to n, a signal input terminal being an input terminal other than the reference terminal. For any integer j greater than or equal to 1 and less than or equal to n, we define the input current flowing into the signal input terminal j and the input voltage between the signal input terminal j and the reference terminal. Let us note $I_I$ the column-vector of the input currents $i_{I1}, \ldots, i_{In}$, and let us note $V_I$ the column-vector of the input voltages $v_{I1}, \ldots, v_{In}$. If we assume that the amplifier is linear, it is characterized, in frequency domain, by the two following equations:

$$I_I = Y_I V_I + Y_R V_O \quad (1)$$

$$I_O = Y_T V_I + Y_O V_O \quad (2)$$

where $Y_I, Y_R, Y_T$ and $Y_O$ are n×n matrices. All components of these matrices have the dimensions of admittance. Consequently, we will refer to $Y_I$ as the "input admittance matrix" of the amplifier, to $Y_R$ as the "reverse transfer admittance matrix" of the amplifier, to $Y_T$ as the "transfer admittance matrix" of the amplifier, and to $Y_O$ as the "output admittance matrix" of the amplifier. These four matrices have complex components and may be frequency-dependent.

In the case where an amplifier having n signal output terminals and n signal input terminals does not exactly comply with the equations (1) and (2), the specialists understand that these equations are nevertheless valid for small signals, at a given quiescent operating point, if the noise produced by the amplifier is neglected.

If we disregard the case of a plurality of independent amplifiers each having a single input and a single output (in this case $Y_I, Y_R, Y_T$ and $Y_O$ are diagonal matrices), the only type of multiple-input and multiple-output amplifier commonly found in the literature is the differential pair, for which the output currents are the two collector currents (in the case of an implementation using bipolar transistors) or the two drain currents (in the case of an implementation using field-effect transistors). In the small signal approximation, the differential pair becomes linear, and the ideal behavior expected from a differential pair in which the emitter or source currents are supplied by a current source corresponds to $$Y_T = \begin{pmatrix} G_{TB} & -G_{TB} \\ -G_{TB} & G_{TB} \end{pmatrix} \quad (3)$$

where $G_{TB}$ is a conductance depending on biasing. We note that this matrix is neither diagonal nor invertible.

The prior art applicable to this application includes: the prior art presented in the French patent application no. 06/00388 of 17 Jan. 2006 entitled "Amplificateur à entrées multiples et sorties multiples" and in the international application no. PCT/IB2006/003950 of 19 Dec. 2006, entitled "multiple-input and multiple-output amplifier", and the invention described in them. In said French patent application no. 06/00388 and international application no. PCT/IB2006/003950, a feedback network having a terminal connected to said reference terminal, the feedback network also having n other terminals, provides a transfer admittance matrix approximating a given admittance matrix, this given admittance matrix being a non-diagonal and invertible n×n matrix.

In said French patent application no. 06/00388 and international application no. PCT/IB2006/003950 it is said that the feedback network may be a network of resistors, and that it may also comprise reactive circuit elements such as capacitors and/or inductors (in French: "inductance"), and active circuit elements. According to usage and to the "Dictionnaire CEI multilingue de l'électricité" published in 1983 by the Bureau Central de la Commission Electrotechnique Internationale, we note that the English word "inductor" designates either a 2-terminal circuit element comprising a winding, or a linear 2-terminal circuit element characterized by the quantity "inductance" (in French: "inductance propre"), and that the French word "inductance" designates either the quantity "inductance" (in French: "inductance propre"), or a 2-terminal circuit element comprising a winding, or a linear 2-terminal circuit element characterized by the quantity "inductance". However, the French word "inductance" cannot be used to designate the quantity referred to as "mutual inductance". In said French patent application no. 06/00388 and international application no. PCT/IB2006/003950, the phenomenon of mutual induction is therefore not considered.

In this approach, the removal of some circuit elements of the feedback network (and the replacement of each of these circuit elements by an open-circuit or a short-circuit, according to the case) may clearly change the impedance matrix of the feedback network into a diagonal matrix, and in this case the matrices $Y_I, Y_R, Y_T$ and $Y_O$ become diagonal. Conversely, it is therefore possible to say that, by adding some circuit elements to a feedback network having a diagonal impedance matrix, we obtain a new feedback network having a non-diagonal impedance matrix $Z_{FB}$, and consequently non-diagonal components in the matrices $Y_I$, $Y_R$, $Y_T$ and $Y_O$. In French patent application no. 06/00388 and international application no. PCT/IB2006/003950, the non-diagonal components of $Y_I$, $Y_R$, $Y_T$ and $Y_O$ correspond to increased component count and cost.

SUMMARY OF THE INVENTION

The purpose of the invention is a multiple-input and multiple-output amplifier having an equal number of inputs and outputs, without the limitations of known techniques.

A multiple-input and multiple-output amplifier of the invention, having one reference terminal, n signal input terminals and n signal output terminals, where n is an integer greater than or equal to 3, for providing, in a known frequency band, a transfer admittance matrix approximating a given admittance matrix, this given admittance matrix being a non-diagonal and invertible n×n matrix, comprises:

n active sub-circuits, each active sub-circuit having a sub-circuit input terminal, a sub-circuit output terminal and a sub-circuit common terminal, the sub-circuit input terminal being connected to one of said signal input terminals and the sub-circuit output terminal being connected to one of said signal output terminals, each active sub-circuit being such that the current flowing out of the sub-circuit common terminal and the current flowing into the sub-circuit output terminal depend on the voltage between the sub-circuit input terminal and the sub-circuit common terminal, each said signal input terminal being connected to only one sub-circuit input terminal and each said signal output terminal being connected to only one sub-circuit output terminal;

a feedback network having a terminal connected to said reference terminal, the feedback network also having n other terminals each being connected to the sub-circuit common terminal of one of said active sub-circuits, the feedback network presenting, in the known frequency band, a non-diagonal impedance matrix, this impedance matrix being defined with respect to said reference terminal, the feedback network comprising two or more windings arranged in such a way that, in a part of the known frequency band, the mutual induction between the different windings of the feedback network has a non-negligible influence on the value of one or more non-diagonal components of said impedance matrix, the feedback network producing a negative feedback such that, in the known frequency band, said transfer admittance matrix approximates said given admittance matrix.

According to the invention, the feedback network comprises at least two windings, A and B. Let us note $L_A$ the inductance of the winding A, $L_B$ the inductance of the winding B and $M_{AB}$ the mutual inductance between the windings A and B. The feedback network may also comprise other windings C, D, etc, and we define in this case the inductances $L_C$, $L_D$, etc, and the mutual inductances $M_{AC}$, $M_{AD}$, $M_{BC}$, $M_{BD}$, $M_{CD}$, etc. The coefficient of coupling between two windings is the ratio of the absolute value of the mutual inductance to the square root of the product of the inductances, for instance $|M_{AB}|/(L_A L_B)^{1/2}$ in the case of the windings A and B. We note finally that inductances, mutual inductances and coefficients of coupling are frequency-dependent.

At a given frequency f in said known frequency band, let us use $Y_G$ to denote said given admittance matrix, and $Z_{FB}$ to denote the impedance matrix of the feedback network with respect to said reference terminal. According to the invention, the mutual induction between the different windings of the feedback network has a non-negligible influence on the value of one or more non-diagonal components of the matrix $Z_{FB}$, in said part of the known frequency band. This condition means that, if mutual induction was not present (in other words, if the mutual inductances $M_{AC}$, $M_{AD}$, $M_{BC}$, $M_{BD}$, $M_{CD}$, etc, were all equal to zero), at least one non-diagonal component of the matrix $Z_{FB}$ would undergo a non-negligible change, in said part of the known frequency band.

According to the invention, said windings may for instance be such that at least one coefficient of coupling between two windings is greater than or equal to one percent, in said part of the known frequency band. This value is obviously sufficient to obtain that the mutual induction between the different windings of the feedback network may have a non-negligible influence on the value of one or more non-diagonal components of the matrix $Z_{FB}$. Moreover, the specialist understands that a coefficient of coupling greater than or equal to 0.01=1% cannot be the consequence of an unexpected coupling between inductances.

According to the invention, two or more windings of the feedback network, arranged in such a way that mutual induction appears between such windings, may for instance be windings of the same transformer. Such a transformer may comprise a magnetic circuit. Such a transformer may also not comprise a magnetic circuit.

According to the invention, two or more windings of the feedback network, arranged in such a way that mutual induction appears between such windings, may for instance be windings made of printed circuit board traces, taking for instance the shape of a spiral. Windings made of printed circuit board traces, without magnetic circuit, are for instance described in the article of S. Stalf entitled "Printed Inductors in RF Consumer Applications", published in the journal *IEEE Transactions on Consumer Electronics*, Vol. 47, No. 3, pages 426 to 435, in August 2001. Windings made of printed circuit board traces, with magnetic circuit, are for instance described in the article of M. Ludwig et al entitled "PCB Integrated Inductors for Low Power DC/DC Converters", published in the journal *IEEE Transactions on Power Electronics*, Vol. 18, No. 4, pages 937 to 945, in July 2003.

According to the invention, two or more windings of the feedback network, arranged in such a way that mutual induction appears between such windings, may for instance be windings built in an integrated circuit. Such windings are for instance described in the article of Y. K. Koutsoyannopoulos and Y. Papananos entitled "Systematic Analysis and Modeling of Integrated Inductors and Transformers in RF IC Design", published in the journal *IEEE Transactions on Circuits and Systems II: Analog and Digital Signal Processing*, Vol. 47, No. 8, pages 699 to 713, in August 2000.

As is the case with the device described in said French patent application no. 06/00388 and international application no. PCT/IB2006/003950, according to the invention, said feedback network may be exclusively composed of linear, passive and reciprocal circuit elements. As an example, the feedback network may, in addition to the windings, comprise resistors and capacitors.

Said feedback network may also comprise one or more active components, for instance one or more insulated-gate field-effect transistor (MOSFET). Moreover, the specialist understands that, in order to obtain that said transfer admittance matrix better approximates said given admittance matrix, it may be desirable to adjust said non-diagonal impedance matrix, using components presenting an adjustable impedance. Such components may be adjustable by electrical means, such as a MOSFET used in the ohmic regime providing a variable resistance, or such as a variable capacitance diode providing a variable capacitance. Consequently, according to the invention, said feedback network may be such that said non-diagonal impedance matrix can be adjusted by electrical means.

Specialists have knowledge of methods for computing mutual inductances between windings, and are therefore able to design the feedback network of a multiple-input and multiple-output amplifier of the invention. The methods for taking into account the mutual inductances between the windings for determining $Z_{FB}$ notwithstanding, a multiple-input and multiple-output amplifier of the invention may be proportioned using the equations shown in said French patent application no. 06/00388 and international application no. PCT/IB2006/003950. In particular, according to the invention, the multiple-input and multiple-output amplifier may be such that said active sub-circuits have an absolute value of the ratio of the current flowing out of the sub-circuit common terminal to the voltage between the sub-circuit input terminal and the sub-circuit common terminal much larger than the absolute values of all components of the inverse of the impedance matrix $Z_{FB}$ of the feedback network.

The specialist understands that the matrices $Y_I$, $Y_R$, $Y_T$ and $Y_O$ may be computed based on the characteristics of each active sub-circuit and on the matrix $Z_{FB}$. The specialist understands that, when the output terminals of a multiple-input and multiple-output amplifier of the invention are connected to a load presenting the impedance matrix $Z_L$, the input terminals of a multiple-input and multiple-output amplifier present an admittance matrix $Y_{LI}$, which we will call the loaded input admittance matrix. The loaded input admittance matrix is given by:

$$Y_{LI}=Y_I-Y_R(1_n+Z_LY_O)^{-1}Z_LY_T=Y_I-Y_RZ_L(1_n+Y_OZ_L)^{-1}Y_T \quad (4)$$

where $1_n$ is the identity matrix of size n×n. In the special case $Z_L=0_n$, where $0_n$ is the null matrix of size n×n, we have $Y_{LI}=Y_I$. Consequently, the input admittance matrix defined by equation (1) is a special case of the loaded input admittance matrix, for short-circuited output terminals.

In the same way, the specialist understands that, when the input terminals of a multiple-input and multiple-output amplifier of the invention are connected to a source presenting the impedance matrix $Z_S$, the output terminals of a multiple-input and multiple-output amplifier present an admittance matrix $Y_{LO}$, which we will call the loaded output admittance matrix. The loaded output admittance matrix is given by:

$$Y_{LO}=Y_O-Y_T(1_n+Z_SY_I)^{-1}Z_SY_R=Y_O-Y_TZ_S(1_n+Y_IZ_S)^{-1}Y_R \quad (5)$$

In the special case $Z_S=0_n$, we have $Y_{LO}=Y_O$. Consequently, the output admittance matrix defined by equation (2) is a special case of the loaded output admittance matrix, for short-circuited input terminals.

According to the invention, the active sub-circuits and the feedback network are proportioned in such a way that the negative feedback produces a transfer admittance matrix $Y_T$ approximating said given admittance matrix $Y_G$ in the known frequency band. The specialist understands that it also possible to proportion the active sub-circuits and the feedback network, in such a way that the loaded output admittance matrix $Y_{LO}$ of the multiple-input and multiple-output amplifier approximates a first wanted matrix and/or that the loaded input admittance matrix $Y_{LI}$ of the multiple-input and multiple-output amplifier approximates a second wanted matrix. However, for a given matrix $Y_G$, the first wanted matrix and/or the second wanted matrix cannot be chosen arbitrarily, because the available parameters only leave a limited flexibility, in general. Note that, according to equation (16) of said French patent application no. 06/00388 and international application no. PCT/IB2006/003950, each active sub-circuit is characterized by 9 complex parameters, and note that a reciprocal feedback network is characterized by n(n+1)/2 complex parameters. If he uses a reciprocal feedback network, the designer may at best control n(n+1)/2 complex parameters. Said French patent application no. 06/00388 and international application no. PCT/IB2006/003950 explain that, if the given admittance matrix $Y_G$ is symmetrical, the designer may always find parameter values suitable for obtaining a transfer admittance matrix $Y_T$ approximating $Y_G$ and for satisfying additional conditions. These additional conditions may be used to obtain that the loaded output admittance matrix $Y_{LO}$ approximates a first wanted matrix $Y_{WLO}$ and/or that the loaded input admittance matrix $Y_{LI}$ approximates a second wanted matrix $Y_{WLI}$.

When the output terminals of a multiple-input and multiple-output amplifier of the invention are connected to a load presenting the impedance matrix $Z_L$, we have:

$$V_O=-(1_n+Z_LY_O)^{-1}Z_LY_TV_I=-Z_L(1_n+Y_OZ_L)^{-1}Y_TV_I \quad (6)$$

Consequently, we may define the voltage gain matrix $G_V$ of the multiple-input and multiple-output amplifier of the invention as:

$$G_V=-(1_n+Z_LY_O)^{-1}Z_LY_T=-Z_L(1_n+Y_OZ_L)^{-1}Y_T \quad (7)$$

Therefore, it is equivalent to say that a multiple-input and multiple-output amplifier is "intended to provide, in a known frequency band, a transfer admittance matrix approximating a given admittance matrix", or that it is "intended to provide, in a known frequency band, a voltage gain matrix approximating a given gain matrix". The specialist understands that other equivalent wording are also possible.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment (Best Mode)

Figure 1:
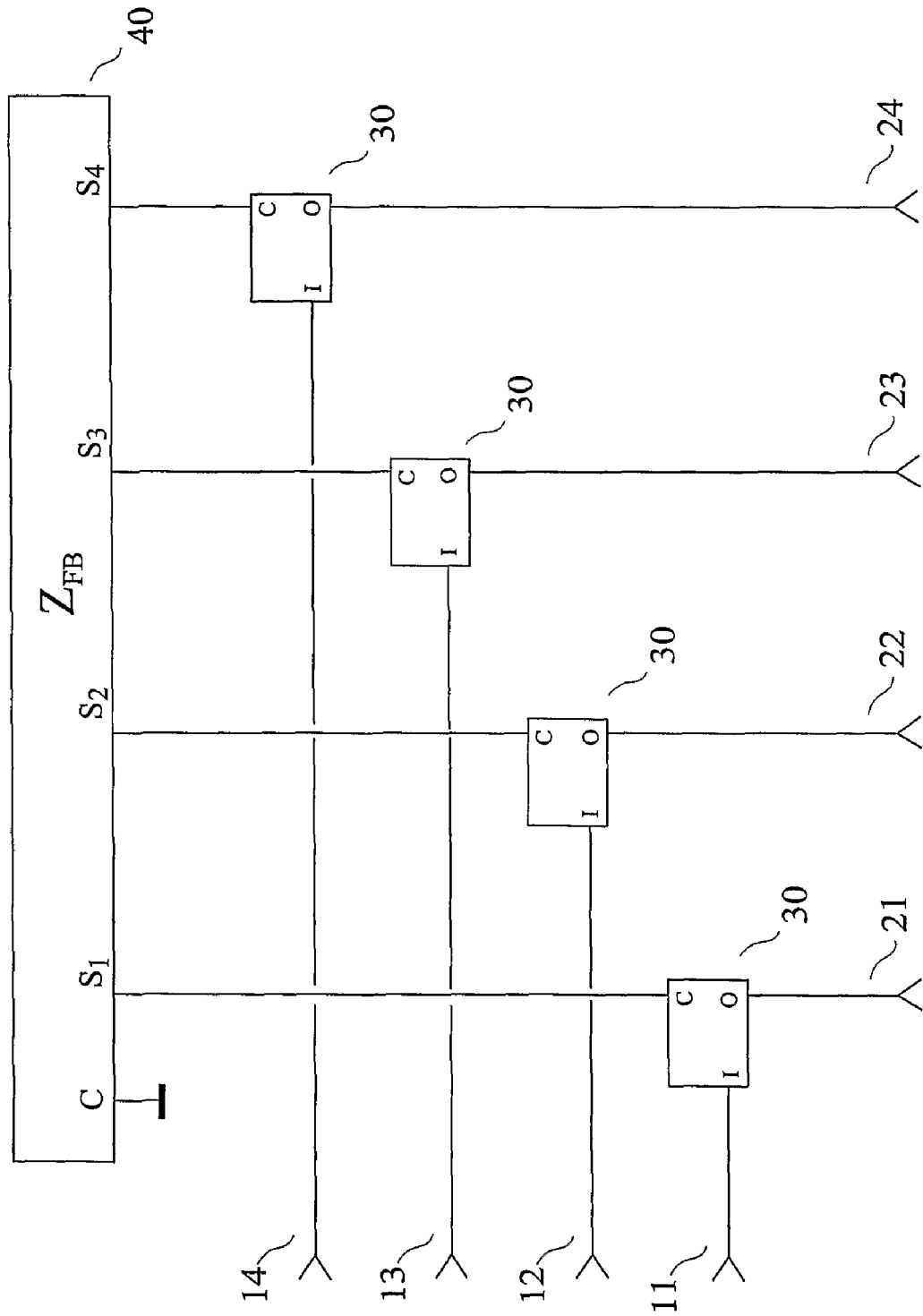
FIG. 1 shows a first embodiment and a second embodiment of the invention.

As a first embodiment of a device of the invention, given by way of non-limiting example and best mode of carrying out the invention, we have represented in FIG. 1 a multiple-input and multiple-output amplifier of the invention comprising 4 signal input terminals (11) (12) (13) (14), 4 signal output terminals (21) (22) (23) (24), 4 active sub-circuits (30) and a feedback network (40). Each active sub-circuit has a sub-circuit input terminal connected to one of the signal input terminals (11) (12) (13) (14), a sub-circuit output terminal connected to one of the signal output terminals (21) (22) (23)

(24), and a sub-circuit common terminal. Each active sub-circuit is such that the current flowing out of the sub-circuit common terminal and the current flowing into the sub-circuit output terminal depend on the voltage between the sub-circuit input terminal and the sub-circuit common terminal. The feedback network (40) has a terminal connected to the reference terminal represented as the ground symbol in FIG. 1. The feedback network (40) also has 4 other terminals, each being connected to the sub-circuit common terminal of a different active sub-circuit (30). The feedback network presents, in the known frequency band, an impedance matrix $Z_{FB}$, this impedance matrix being defined with respect to said reference terminal, the feedback network producing a negative feedback such that, in the known frequency band, the transfer admittance matrix $Y_T$ of the multiple-input and multiple-output amplifier approximates said given admittance matrix $Y_G$.

Figure 2:
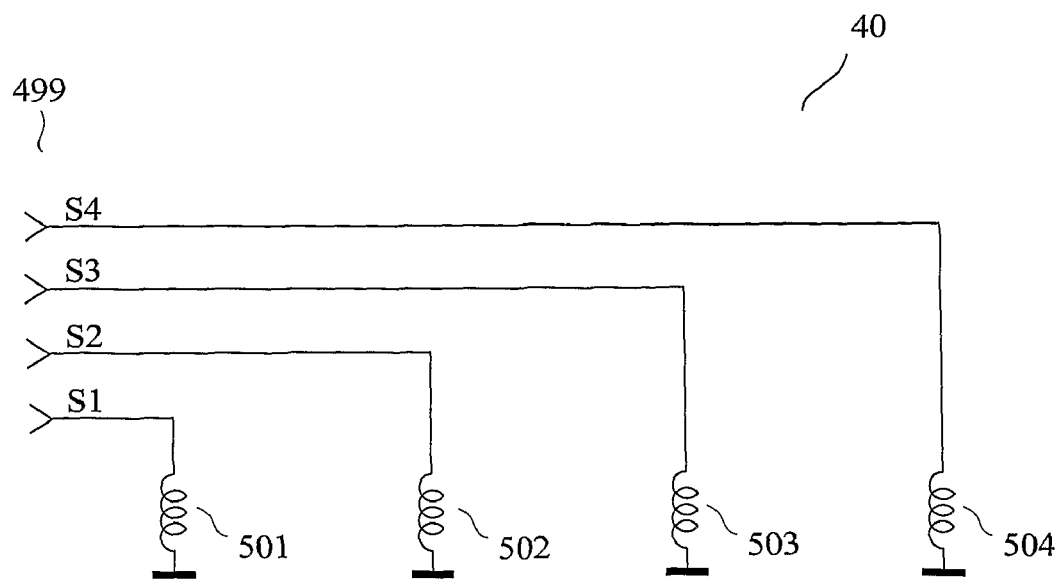
FIG. 2 shows a feedback network used in the first embodiment.

The schematic diagram of FIG. 2 shows a feedback network (40) used in this first embodiment, having a terminal connected to the reference terminal (shown as the ground symbol) and four other terminals (499). The feedback network (40) is made of four windings (501) (502) (503) (504) each connected between one of the other terminals (499) and the reference terminal. We shall use $L_1$, $L_2$, $L_3$ and $L_4$ to denote the inductances of the windings (501), (502), (503) and (504), respectively. We shall use $R_1$, $R_2$, $R_3$ and $R_4$ to denote the resistances of the windings (501), (502), (503) and (504), respectively. Six mutual inductances $M_{ij}$ between these windings must be taken into account. The impedance matrix $Z_{FB}$ of the feedback network is given by:

$$Z_{FB} = \begin{pmatrix} R_1 + j\omega L_1 & j\omega M_{12} & j\omega M_{13} & j\omega M_{14} \\ j\omega M_{12} & R_2 + j\omega L_2 & j\omega M_{23} & j\omega M_{24} \\ j\omega M_{13} & j\omega M_{23} & R_3 + j\omega L_3 & j\omega M_{34} \\ j\omega M_{14} & j\omega M_{24} & j\omega M_{34} & R_4 + j\omega L_4 \end{pmatrix} \quad (8)$$

where $\omega$ is the radian frequency. In this embodiment, the coefficients of coupling $|M_{12}|/(L_1 L_2)^{1/2}$, $|M_{23}|/(L_2 L_3)^{1/2}$ and $|M_{34}|/(L_3 L_4)^{1/2}$ are greater than 4%, and all non-diagonal components of the matrix $Z_{FB}$ are attributable to the mutual induction between the different windings of the feedback network.

As shown in this first embodiment, according to the invention, the multiple-input and multiple-output amplifier may be such that the number n of signal output terminals is greater than or equal to 4.

In this first embodiment, each active sub-circuit comprises connections (not shown in FIG. 1) to the reference terminal and to a source of electrical power providing a voltage of +4.5 V, each active sub-circuit comprising a single active component (this circuit element is a bipolar transistor) and several passive components. The active sub-circuits and the feedback network are proportioned in such a way that the negative feedback produces a transfer admittance matrix $Y_T$ approximating said given admittance matrix $Y_G$ in the known frequency band, the known frequency band being the 1.8 GHz to 2.0 GHz band in this first embodiment. The active sub-circuits and the feedback network are proportioned in such a way that the loaded input admittance matrix $Y_{LI}$ of the multiple-input and multiple-output amplifier approximates a wanted matrix $Y_{WLI}$ which provides a high signal-to-noise ratio.

Second Embodiment

The second embodiment of a device of the invention, given by way of non-limiting example, also corresponds to the multiple-input and multiple-output amplifier of the invention represented in FIG. 1.

Figure 3:
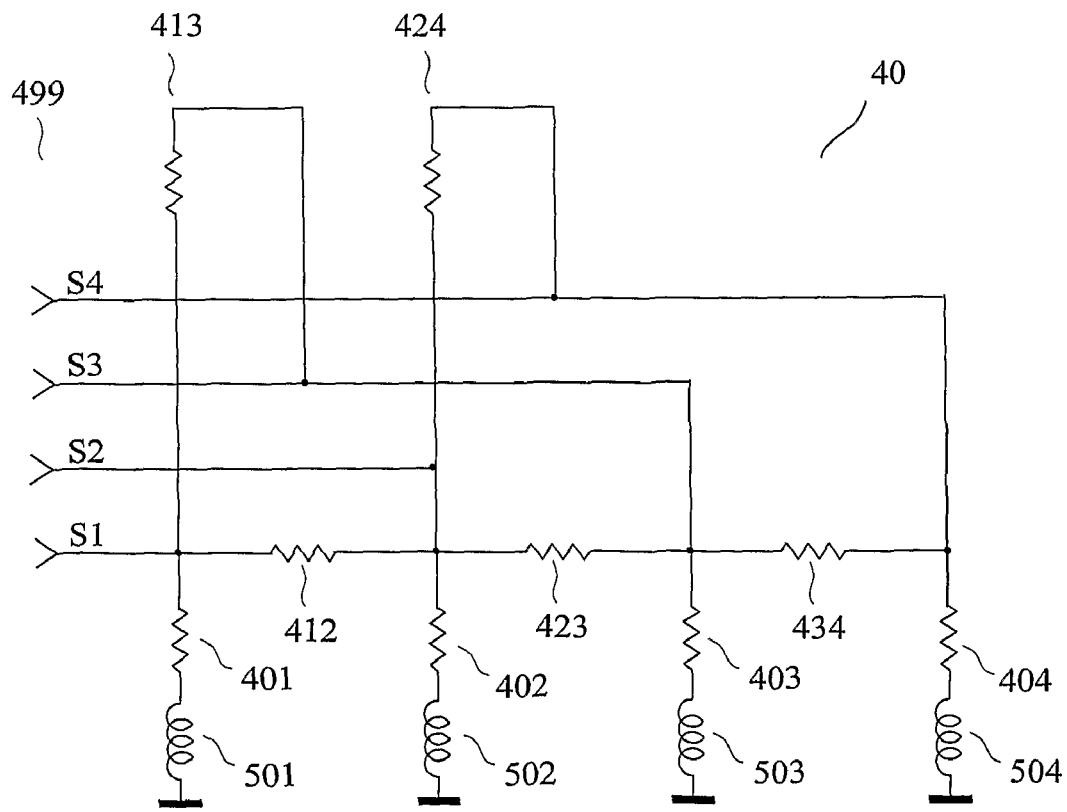
FIG. 3 shows a feedback network used in the second embodiment.

The schematic diagram of FIG. 3 shows a feedback network (40) used in this second embodiment, having a terminal connected to the reference terminal (shown as the ground symbol) and four other terminals (499). The feedback network (40) is made of four windings (501), (502), (503) and (504) each connected in series with one of the four resistors (401), (402), (403) and (404). The non-diagonal components in the impedance matrix $Z_{FB}$ of the feedback network are attributable to the mutual induction between the different windings and to the five resistors (412), (423), (434), (413) and (424). We note that, in this second embodiment, the impedance matrix $Z_{FB}$ of the feedback network is invertible and non-diagonal at all frequencies.

In this second embodiment, each active sub-circuit is a second-generation current conveyor, and each active sub-circuit comprises connections (not shown in FIG. 1) to the reference terminal and to sources of electrical power providing the voltages of +5 V and −5V. The active sub-circuits and the feedback network are proportioned in such a way that the negative feedback produces a transfer admittance matrix $Y_T$ approximating said given admittance matrix $Y_G$ in the known frequency band, the known frequency band being the 0 Hz to 300 MHz band in this second embodiment. At least 20% of the absolute value of at least one non-diagonal component of the impedance matrix $Z_{FB}$ of the feedback network is attributable to the mutual induction between the different windings of the feedback network in the part of the known frequency band corresponding to frequencies greater than 50 MHz. The active sub-circuits and the feedback network are proportioned in such a way that the loaded output admittance matrix $Y_{LO}$, and the loaded input admittance matrix $Y_{LI}$ of the multiple-input and multiple-output amplifier may be regarded as equal to zero.

Third Embodiment

Figure 4:
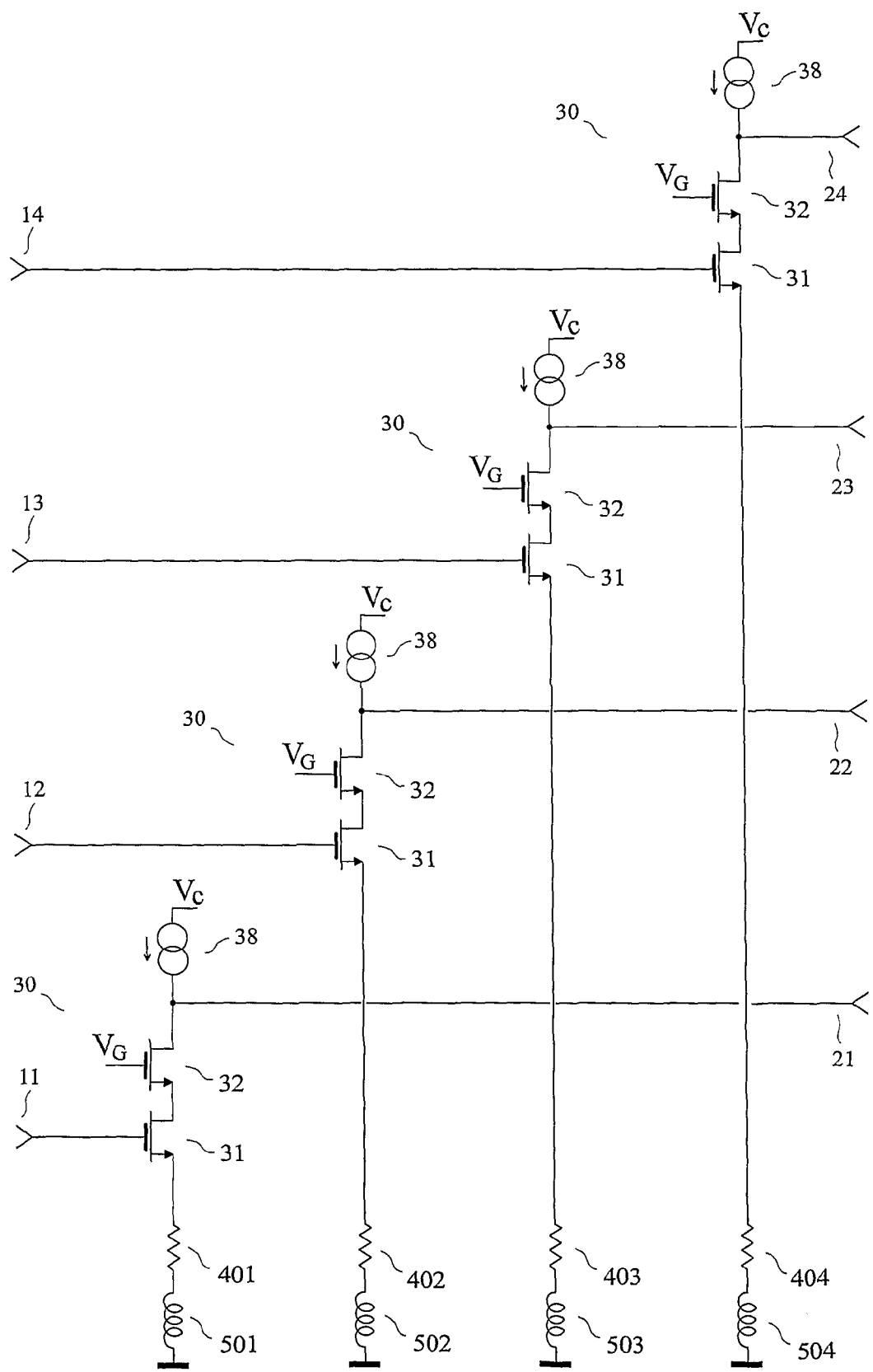
FIG. 4 shows a third embodiment.

The third embodiment of a device of the invention, given by way of non-limiting example, corresponds to the multiple-input and multiple-output amplifier of the invention represented in FIG. 4. This multiple-input and multiple-output amplifier comprises 4 signal input terminals (11) (12) (13) (14), 4 signal output terminals (21) (22) (23) (24), 4 active sub-circuits (30) and a feedback network.

In FIG. 4, the 4 active sub-circuits (30) each comprise a first MOSFET (31) and a second MOSFET (32) in the cascode configuration well known to specialists. The four current sources (38) provide the biasing of the sub-circuit output terminals. The bias voltage $V_G$ for the gates of the second MOSFET (32) must be provided by external circuits not shown in FIG. 4. An appropriate biasing of the signal input terminals (11) (12) (13) (14) must be provided by external circuits not shown in FIG. 4.

The feedback network is made of four resistors (401), (402), (403) and (404) and of four windings (501), (502), (503) and (504) presenting a non-negligible mutual induction between them. We note that, in this third embodiment, the impedance matrix $Z_{FB}$ of the feedback network is invertible at all frequencies, but that it is non-diagonal only at frequencies greater than 0 Hz.

The active sub-circuits and the feedback network are proportioned in such a way that the negative feedback produces a transfer admittance matrix $Y_T$ approximating said given admittance matrix $Y_G$ in the known frequency band, the known frequency band being the 0 Hz to 5 GHz band in this third embodiment. All non-diagonal components of the matrix $Z_{FB}$ are attributable to the mutual induction between the different windings of the feedback network.

INDICATIONS ON INDUSTRIAL APPLICATIONS

The invention is suitable for applications in which multiple-input and multiple-output amplifiers providing, in a known frequency band, a transfer admittance matrix approximating a given admittance matrix $Y_G$ are needed, this given admittance matrix being a non-diagonal and invertible n×n matrix. For realizations in which the feedback network is made of reciprocal, passive and linear circuit elements, this matrix $Y_G$ must approximate a symmetrical matrix. Consequently, the invention is particularly suitable as a device providing n linear combinations of n signals, defined by such a square matrix. Such devices may for instance be used for analog signal processing.

Because of the role played by mutual induction in the feedback network, the invention is particularly suitable for applications in which the non-diagonal components of the given admittance matrix $Y_G$ are frequency-dependent, in the known frequency band.

Specialists know that mutual induction does not produce thermal noise, contrary to power dissipation in resistors. Consequently, the feedback network of a multiple-input and multiple-output amplifier of the invention may be designed in such a way that it only produces a low noise. The invention is therefore particularly suitable for applications requiring a low noise level.

Specialists know that single-input and single-output amplifiers using a series-series feedback produced by an inductance may simultaneously provide a low noise figure and a maximum power gain, as mentioned in the article of B. K. Ko and K. Lee entitled "A Comparative Study on the Various Monolithic Low Noise Amplifier Circuit Topologies for RF and Microwave Applications", published in the journal *IEEE Journal of Solid-State Circuits*, vol. 31, No. 8, pages 1220 to 1225, in August 1996. We have mentioned that a multiple-input and multiple-output amplifier of the invention may be such that the loaded output admittance matrix $Y_{LO}$ approximates a first wanted matrix $Y_{WLO}$ and that the loaded input admittance matrix $Y_{LI}$ approximates a second wanted matrix $Y_{WLI}$. Specialists understand that this possibility may provide a loaded output admittance matrix and a loaded input admittance matrix producing a maximum power gain. Specialists also understand that a multiple-input and multiple-output amplifier of the invention may simultaneously provide an optimal noise figure and an optimal power gain, similarly to the case of a single-input and single-output amplifier.

The specialist understands that a combined multiple-input and multiple-output amplifier having m signal input terminals and n signal output terminals may comprise:
  a multiple-input and multiple-output voltage-mode amplifier having m signal input terminals and n signal output terminals, providing, in a known frequency band, a n×m voltage gain matrix $G_V$, the signal inputs terminals of the combined multiple-input and multiple-output amplifier being connected to the signal input terminals of the multiple-input and multiple-output voltage-mode amplifier;
  a multiple-input and multiple-output amplifier of the invention having n signal input terminals and n signal output terminals, providing, in the known frequency band, a transfer admittance matrix approximating a given admittance matrix $Y_G$ this given admittance matrix being a non-diagonal and invertible n×n matrix, the signal output terminals of the multiple-input and multiple-output voltage-mode amplifier being connected to the signal input terminals of the multiple-input and multiple-output amplifier of the invention, and the signal output terminals of the multiple-input and multiple-output amplifier of the invention being connected to the signal output terminals of the combined multiple-input and multiple-output amplifier, in such a way that, in the known frequency band, the transfer admittance matrix of the combined multiple-input and multiple-output amplifier approximates the n×m admittance matrix $Y_G G_V$.

The person skilled in the art understands that an important feature of such a combined multiple-input and multiple-output amplifier is that the admittance matrix $Y_G G_V$ is not necessarily a square matrix. When it is a square matrix, this transfer admittance matrix $Y_G G_V$ is neither necessarily invertible nor necessarily symmetrical when $Y_G$ is symmetrical.

Consequently, the multiple-input and multiple-output amplifier of the invention can be used as a building block of another multiple-input and multiple-output amplifier, such as the combined multiple-input and multiple-output amplifier described above. The person skilled in the art understands that the multiple-input and multiple-output amplifier of the invention can also be used as a building block of other types of multiple-input and multiple-output amplifiers. For instance, it is possible to cascade two multiple-input and multiple-output amplifiers of the invention, by connecting the signal output terminals of the first multiple-input and multiple-output amplifier to the signal input terminal of the second multiple-input and multiple-output amplifier.

The specialist understands that a multiple-input and multiple-output amplifier with input network having n signal input terminals and n signal output terminals may comprise:
  a passive linear network having n signal input terminals and n signal output terminals, the signal input terminals of the multiple-input and multiple-output amplifier with input network being connected to the signal input terminals of the passive linear network;
  a multiple-input and multiple-output amplifier of the invention having n signal input terminals and n signal output terminals, the signal output terminals of the passive linear network being connected to the signal input terminals of the multiple-input and multiple-output amplifier of the invention, and the signal output terminals of the multiple-input and multiple-output amplifier of the invention being connected to the signal output terminals of the multiple-input and multiple-output amplifier with input network. The specialist understands that a multiple-input and multiple-output amplifier with input network may provide characteristics which are necessary for a particular application.

The specialist understands that a multiple-input and multiple-output amplifier with output network having n signal input terminals and n signal output terminals may comprise:
  a multiple-input and multiple-output amplifier of the invention having n signal input terminals and n signal output terminals, the signal input terminals of the multiple-input and multiple-output amplifier with output network being connected to the signal input terminals of the multiple-input and multiple-output amplifier of the invention;

a passive linear network having n signal input terminals and n signal output terminals, the signal output terminals of the multiple-input and multiple-output amplifier of the invention being connected to the signal input terminals of the passive linear network, and the signal output terminals of the passive linear network being connected to the signal output terminals of the multiple-input and multiple-output amplifier with output network. The specialist understands that a multiple-input and multiple-output amplifier with output network may provide characteristics which are necessary for a particular application. The specialist understands that he may also define a multiple-input and multiple-output amplifier with input network and output network, for obtaining characteristics which are necessary for a particular application.

The specialist understands that a multiple-input and multiple-output amplifier with parallel network having n signal input terminals and n signal output terminals may comprise:

a multiple-input and multiple-output amplifier of the invention having n signal input terminals and n signal output terminals, the signal input terminals of the multiple-input and multiple-output amplifier with parallel network being connected to the signal input terminals of the multiple-input and multiple-output amplifier of the invention and the signal output terminals of the multiple-input and multiple-output amplifier with parallel network being connected to the signal output terminals of the multiple-input and multiple-output amplifier of the invention;

a passive linear network having n signal input terminals and n signal output terminals, the signal input terminals of the multiple-input and multiple-output amplifier with parallel network being connected to the signal input terminals of the passive linear network and the signal output terminals of the multiple-input and multiple-output amplifier with parallel network being connected to the signal output terminals of the passive linear network. The specialist understands that a multiple-input and multiple-output amplifier with parallel network may provide characteristics which are necessary for a particular application, for instance thanks to an additional feedback caused by the passive linear network.

The invention claimed is:

1. A multiple-input and multiple-output amplifier having one reference terminal, n signal input terminals and n signal output terminals, where n is an integer greater than or equal to 3, the multiple-input and multiple-output amplifier comprising:

n active sub-circuits, each active sub-circuit having a sub-circuit input terminal, a sub-circuit output terminal and a sub-circuit common terminal, the sub-circuit input terminal being connected to one of said signal input terminals and the sub-circuit output terminal being connected to one of said signal output terminals, each active sub-circuit being configured such that current flowing out of the sub-circuit common terminal and current flowing into the sub-circuit output terminal depend on a voltage between the sub-circuit input terminal and the sub-circuit common terminal, each said signal input terminal being connected to only one sub-circuit input terminal and each said signal output terminal being connected to only one sub-circuit output terminal; and a feedback network having a terminal connected to said reference terminal, the feedback network also having n other terminals each being connected to the sub-circuit common terminal of one of said active sub-circuits, the feedback network presenting, in a known frequency band, a non-diagonal impedance matrix, this impedance matrix being defined with respect to said reference terminal, the feedback network comprising two or more windings arranged in such a way that, in a part of the known frequency band, the mutual induction between the different windings of the feedback network has a non-negligible influence on the value of one or more non-diagonal components of said impedance matrix.

2. The multiple-input and multiple-output amplifier of claim 1, wherein the feedback network produces a negative feedback such that, in the known frequency band, the transfer admittance matrix of the multiple-input and multiple-output amplifier approximates a given admittance matrix, this given admittance matrix being a non-diagonal and invertible n×n matrix.

3. The multiple-input and multiple-output amplifier of claim 1, wherein at least one coefficient of coupling between two windings is greater than or equal to one percent, in said part of the known frequency band.

4. The multiple-input and multiple-output amplifier of claim 1, wherein two or more windings of the plurality of windings of the feedback network are arranged in such a way that mutual induction appears between such windings and such windings are windings of a same transformer.

5. The multiple-input and multiple-output amplifier of claim 1, wherein two or more windings of the plurality of windings of the feedback network are arranged in such a way that mutual induction appears between such windings and such windings are windings made of printed circuit board traces.

6. The multiple-input and multiple-output amplifier of claim 1, wherein two or more windings of the plurality of windings of the feedback network are arranged in such a way that mutual induction appears between such windings and such windings are windings built in an integrated circuit.

7. The multiple-input and multiple-output amplifier of claim 1, wherein said feedback network comprises linear, passive and reciprocal circuit elements.

8. The multiple-input and multiple-output amplifier of claim 1, wherein said feedback network comprises one or more insulated-gate field-effect transistors.

9. The multiple-input and multiple-output amplifier of claim 1, wherein said feedback network is configured such that said non-diagonal impedance matrix is adjustable by electrical means.

10. The multiple-input and multiple-output amplifier of claim 1, wherein said active sub-circuits have an absolute value of the ratio of the current flowing out of the sub-circuit common terminal to the voltage between the sub-circuit input terminal and the sub-circuit common terminal that is larger than the absolute values of all components of the inverse of said impedance matrix of the feedback network.

11. The multiple-input and multiple-output amplifier of claim 1, wherein the loaded output admittance matrix of the multiple-input and multiple-output amplifier approximates a first wanted matrix.

12. The multiple-input and multiple-output amplifier of claim 1, wherein the loaded input admittance matrix of the multiple-input and multiple-output amplifier approximates a second wanted matrix.

* * * * *